Dec. 23, 1969 W. H. LEGAT ET AL 3,486,087

SMALL CAPACITY SEMICONDUCTOR DIODE

Filed Aug. 30, 1967

INVENTORS
WILHELM H. LEGAT
ALAN F. DIXON

BY [signature]

AGENT

United States Patent Office 3,486,087

Patented Dec. 23, 1969

3,486,087

SMALL CAPACITY SEMICONDUCTOR DIODE

Wilhelm H. Legat, Woodside, and Alan F. Dixon, Palo Alto, Calif., assignors to Raytheon Company, Lexington, Mass., a corporation of Delaware Filed Aug. 30, 1967, Ser. No. 664,326

Int. Cl. H01l 11/00, 15/00

U.S. Cl. 317—235 12 Claims

ABSTRACT OF THE DISCLOSURE

A semiconductor diode having small capacity achieved by an extremely small area P-N junction in an elongated crystalline deposit which is constructed approximately midway thereof, with the junction being located within the area of the constriction, and methods of making such a diode by diffusion and vapor deposition techniques.

BACKGROUND OF THE INVENTION

This invention relates to semiconductor diodes of the varactor type having extremely small capacity. The prior art contains several examples of semiconductor diodes of this type wherein small capacity is intended to be achieved by a small area P-N junction between regions of opposite conductivity type. However, small area junctions have been difficult to achieve because of the manner in which known prior art diodes were fabricated. In one device, for example, a dot of one conductivity type was alloyed to a wafer or chip of the opposite conductivity type. In another device, a layer of one conductivity type was grown directly into a crystal of opposite conductivity type. In both devices, extremely small area junctions were difficult or impossible to form and, consequently, small capacitance was not achieved. In still another prior art device, a conductivity material of one type was diffused into small portion of a body of material of opposite conductivity type. However, this process required difficult control of diffusion techniques in order to produce a small area junction.

SUMMARY OF THE INVENTION

The above and other disadvantages of the prior art are overcome in the present invention by the provision of a novel semiconductor diode wherein an extremely small area junction is provided, thus producing a device having small capacity. The device, in accordance with this invention, comprises a semiconductor diode in a crystalline layer which is thin, in the order of about 1–3 microns thick, and has therein a junction which extends through the layer substantially perpendicularly to the surface thereof, the entire layer being substantially uniformly planar and at the junction being extremely narrow so as to considerably reduce the area of the junction, the opposite conductivity type regions flaring outwardly from the junction on each side thereof so as to provide relatively large opposite conductivity type regions and to provide broad surfaces for metallization and eventual support of metal contacts. In the case where the layer is polycrystalline, it is supported upon a suitable oxide-coated substrate. However, a monocrystalline layer is provided directly upon a crystalline substrate such as sapphire. The metallization lie substantially in a common plane on the surfaces of the respective regions of opposite conductivity type on either side of the junction, but terminate short of the junction in spaced relation with one another to prevent shorting therebetween, the space between metallizations being occupied by dielectric material which covers and passivates the thus exposed edges of the junction.

The polycrystalline device, in accordance with the present invention, may be fabricated upon an oxidized substrate by vapor depositing a suitable thin layer of polycrystalline silicon of one conductivity type and thereafter forming an opposite conductivity type region therein by masking and diffusing steps followed by depositing metal onto the opposite conductivity type polycrystalline regions, and shaping the final structure by conventional photoresist and etching techniques. When making a monocrystalline device, a substrate of sapphire or other suitable crystalline material is employed and a layer of monocrystalline silicon is epitaxially deposited directly upon the substrate. Alternatively, the opposite conductivity type regions of the diode may be fabricated by removing a portion of the vapor deposited polycrystalline layer and providing in place of the removed portion a new vapor deposit of opposite conductivity type in juxtaposition with the remaining portion of the first layer. Then, after suitable lapping and polishing, the metallization, photoresist and etching steps may proceed as described above. With either of these methods a semiconductor diode having an extremely small junction area and, consequently, a small capacitance for feedback current is formed.

BRIEF DESCRIPTION OF THE DRAWINGS

This invention will be better understood from the following description taken in connection with the accompanying drawings, wherein.

DESCRIPTION OF THE PREFERRED EMBODIMENT

Figures 1, 2, 3, 4, 5:
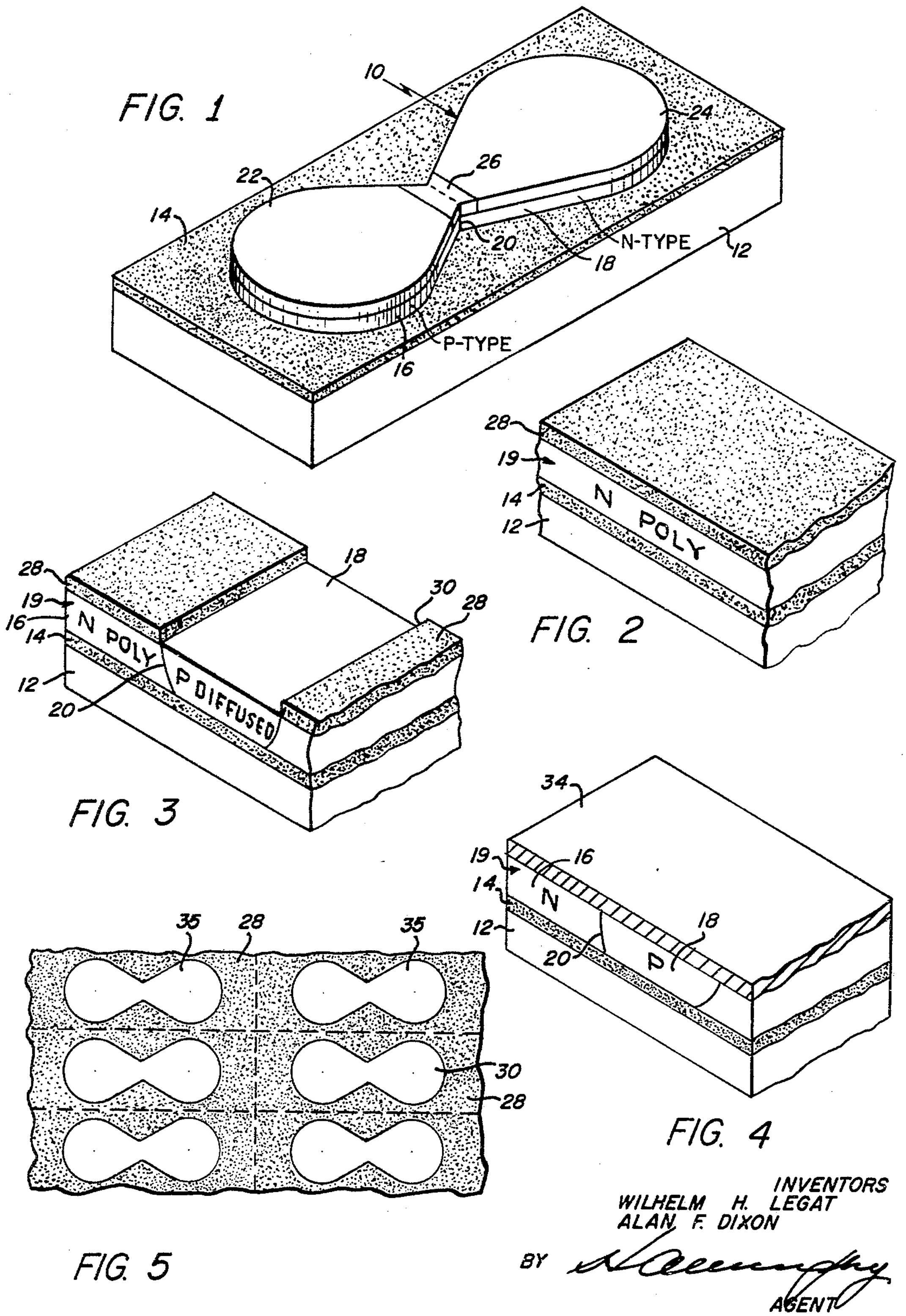
FIG. 1 is an enlarged isometric view of a semiconductor diode embodying the invention.
FIGS. 2–5 are enlarged fragmentary views illustrating various stages during the manufacture of devices embodying the invention.

Referring more particularly to the drawings wherein like characters of reference designate like parts throughout the several views, there is shown in FIG. 1 a low capacitance semiconductor diode embodying the invention. The device comprises an active diode element 10 upon a substrate 12, preferably a portion of a silicon wafer, and insulated therefrom by an insulating oxide layer 14. The active diode element 10 comprises a thin, flat, elongated, leaf-like layer of polycrystalline silicon having a central portion which is narrowed considerably with respect to the portions extending outwardly from the central portion, which outwardly extending portions 16 and 18 are of opposite conductivity types, P or N as the case may be, and are joined at the narrowest constricted area of the structure at a P-N junction 20 which is, due to the unique structure, of extremely small area, thus providing the device with extremely small capacity in comparison with conventional prior art devices of this type.

The device of FIG. 1 is capable of being made in large quantities on a production basis by employing a silicon wafer as a single substrate for supporting a large number of separate individual diodes thereon and which may thereafter be separated easily into individual diode units of the type shown in FIG. 1.

In the manufacture of diodes of this type, the silicon wafer may have a selected N- or P-type conductivity, but may be intrinsic if desired. The wafer, if desired, may be any other suitable support for a vapor-deposited material. For example, quartz or other high dielectric constant material may be used instead of silicon. The wafer 12 is provided with a layer 14 of silicon dioxide which is preferably approximately 3–5 microns in thickness. Oxidation may be accomplished by any of the known thermal growing or other oxidation techniques to form the silicon dioxide film to the desired thickness. In the present device it is preferable that the oxidation take place for a time period of 12–20 hours so that the oxide coating will be relatively thick.

At this point, a layer 19 of N-type polycrystalline material is vapor deposited over the oxide layer 14 as shown in FIG. 2. This is done by conventional well-known vapor deposition techniques which may be briefly described as the decomposition of a silicon compound such as silicon tetrachloride, silane or others at elevated temperatures with hydrogen used as dilutant and a carrier gas. Polycrystalline silicon is deposited onto the oxide surface in a furnace for about 8–15 minutes to produce a thickness of about 14–16 microns. Layer 19 is doped with arsenic, antimony or phosphorus in an amount sufficient to provide it with a resistivity of about 3–5 ohms-cm., for example. However, other thicknesses and amounts of doping may be employed to provide a desired resistivity in accordance with the device requirements.

When making high frequency monocrystalline devices in accordance with this invention, however, the substrate is preferably crystalline, such as sapphire, and silicon is epitaxially deposited directly upon the substrate without the intermediate oxide layer.

It will be understood that in FIG. 2 the polycrystalline N-type layer is designated by numeral 19. This layer 19, after subsequent diffusion as will be described, then becomes the N and P regions 16 and 18, respectively, as illustrated in FIGS. 1, 3 and 4.

At this stage in the device fabrication, the exposed surface of the epitaxial layer 19 is provided with a slight polish and is then oxidized as described above to provide insulating layer 28 (FIG. 2). Then, the oxide layer 28 is coated with a photo-resist material such as the solution known as KPR, sold under that terminology by Eastman-Kodak Company, for example. The photoresist material provides a mask, and the masking technique used here is not in itself unique insofar as this invention is concerned, and, therefore, will be only briefly described herein. A photographic film is prepared with the desired pattern thereon, and the wafer is provided with the layer of photoresist material overlying the silicon dioxide layer 28. The photoresist material is exposed through the film to ultraviolet or other radiation to which it is sensitive, and developing then takes place by dipping the wafer in a developer or solvent such as trichloroethylene to remove unsensitized KPR. The wafer is then baked at about 150° C. for about 10 minutes, whereupon the oxide supports thereon a resultant hardened photoresist mask having the desired configuration or pattern. In the present invention, the pattern of the mask comprises elongated open window areas which take the form of stripes. The silicon dioxide is removed in the open or exposed window areas of the photoresist pattern by placing the wafer in a solution containing about one part of hydrofluoric acid (HF) and nine parts of ammonium fluoride ($NH_4F$) to etch away the exposed areas of silicon dioxide, following which it is rinsed in water and dried. The remaining photoresist may now be removed, if desired, by a stripper or a solution of one part sulphuric acid and nine parts of nitric acid at about 100° C. for about 10 minutes. However, the photoresist may be left on if desired because it will be automatically removed in the following etch process.

The device at this stage appears with alternate exposed stripes of oxide and crystalline N-type silicon. P-type material is now diffused through the thus formed windows 30 into the crystalline layer 19. This diffusion is done in the well-known manner through the windows 30 and, briefly, comprises diffusing boron from a gas phase in a furnace at about 1100° C. for about 15 minutes, then subjecting the device to dry oxygen at a temperature of about 1100° C. for about 25 minutes to drive the boron into the epitaxial layer 19 to the silicon dioxide layer 14. Thus, there are provided in the wafer 12 alternate rows of diffused P-material and N-type material which are indicated in FIG. 3 by numerals 16 and 18. The junctures between materials 16 and 18 thus become P-N junction 20.

Following this, the oxide layer 28 is completely removed, whereupon the surface of the wafer comprises exposed alternate rows of N-type and P-type material on opposite sides of P-N junctions 20. In order to complete the fabrication of the individual diode elements 10, the exposed surface of the entire crystalline layer 19 is covered with a thin layer 34 of metal (FIG. 4). The metal is provided for outlining the surface areas of the individual diode units 10 and also as metallizations to which contacts are to be subsequently attached for connecting the diodes into suitable circuitry. The metal layer 34 may comprise aluminum, chrome-gold, titanium, platinum, or other selected conductive material which may be readily bonded to the semiconductor material. Such a metallized layer 28 can be made by vaporization techniques well known in the art, or by any other desired technique.

In order to accomplish the etching to define the diodes 10, the metal layer 34 is masked by any suitable conventional process such as the process previously described. The metal is then etched away by a suitable metal etchant so as to be removed in all areas except the selected areas 35 (FIG. 5) overlying the individual semiconductor diode units to be formed. Then the diode units are formed by a suitable etching process which may comprise utilizing an etching solution, preferably a saturated solution, i.e., at least 25% of sodium hydroxide (NaOH) in water, preferably in an amount of 33%, or other silicon etchant. The wafer is subjected in the unmetallized areas to the etchant for the time necessary to etch the crystalline layer 19 down to the silicon dioxide layer 14 or, in the case of a monocrystalline layer, down to the sapphire substrate. It will be apparent that the removal of crystalline material in this manner from selected areas of the device results in forming on the silicon dioxide layer 14 a number of mesas, each of which comprises areas of crystalline material with metallized surfaces thereon.

It should be noted that when the metal layer 34 is being etched, this etching includes the metal in the areas overlying the P-N junctions 20. Therefore, the areas of the crystalline layer 18 adjacent the P-N junctions 20 must be suitably masked before etching of the crystalline layer 19 occurs so that the junction areas are completely protected. Such masking over the areas of the junctions can be removed in any desired manner after the diode units 10 have been formed. Then, the surfaces of the crystalline material adjacent the junctions are suitably passivated by depositing $SiO_2$ using the silane-$O_2$ process, for example, over these areas. An additional alloying step may then be undertaken, if needed, depending on the particular metals used.

At this point, the individual semiconductor diodes 10 are completely formed and may be separated from one another by suitably scribing the wafer and breaking in the scribed areas indicated by dotted lines in FIG. 5. Each individual diode now is ready for encapsulation in any suitable manner, which encapsulation does not form a part of this invention.

In a modification of the fabrication techniques, the wafer 12 is provided with the layer 14 of silicon dioxide thereon and the oxide layer is masked and removed over the areas where P-type material is to be provided as described above. In this modified process, however, the crystalline layer in the areas exposed through the windows in the mask are completely removed by suitable abrading or etching techniques completely down to the oxide layer 14 or to the sapphire substrate. At this point, another vapor or epitaxial deposition is performed similar to the deposition described above, but in tthis process crystalline P-type material of suitable resistivity is deposited through the windows in oxide layer 28 over the exposed surfaces of oxide layer 14, with the sides or edges of the new regions joining the previously deposited N-type crystalline regions by the junctions 20. A polishing step follows which removes any P-type material which has been deposited on top of the previously deposited N area, using an abrasive which is softer than silicon dioxide, for example, zirconium oxide. When the abrasive reaches the oxide layer 28, removal of polycrystalline material auotmatically stops. Then, after removal of the oxide layer 28, the fabrication of the device by metallizing and etching, etc., as described above, may continue.

From the foregoing it will be apparent that there has been achieved a novel semiconductor diode having a small area P-N junction whereby the diode is provided with desired small capacity. It will be apparent that various modifications in the device shown and described and in the methods of making same may be employed by those skilled in the art without departing from the spirit of the invention as expressed in the accompanying claims.

What is claimed is:

1. A small capacity semiconductor diode as set forth in claim 1 wherein said metallizations are spaced apart in the area of the junction, and a passivation coating covers the junction between the metallizations.

2. A small capacity semiconductor diode comprising a high dielectric constant substrate having an insulating coating on a surface thereof, and an elongated flat layer of polycrystalline semiconductor material on said coated surface and having a P-N junction therethrough at an intermediate point along its length and having regions of opposite conductivity extending from the junction on either side thereof longitudinally of the layer, the sides of each of said regions being tapered to a narrow constriction at the junction ends thereof, with the junction being disposed at the level of minimum cross-section whereby a small capacitance is provided, and metallizations on each of said regions.

3. A small capacity semiconductor diode as set forth in claim 2 wherein said substrate and said layer are silicon.

4. A small capacity semiconductor diode as set forth in claim 2 wherein said substrate is quartz and said layer is silicon.

5. A small capacity semiconductor diode as set forth in claim 2 wherein said metallizations are spaced apart in the area of the junction, and a passivation coating covers the junction between the metallizations.

6. A small capacity semiconductor diode as set forth in claim 2 wherein crystalline layer has a substantially planar continuous uninterrupted surface.

7. A small capacity semiconductor diode as set forth in claim 6 wherein the P-N junction extends normal to said planar surface and to the longitudinal dimension of said layer.

8. A small capacity semiconductor diode comprising a high dielectric constant crystalline substrate, an elongated flat layer of monocrystalline semiconductor material on said substrate and having a P-N junction therethrough at an intermediate point along its length and having regions of opposite conductivity extending from the junction on either side thereof longitudinally of the layer, the sides of each of said regions being tapered to a narrow constriction at the junction ends thereof with the junction being disposed at the level of minimum cross-section whereby a small capacitance is provided, and metallizations on each of said regions.

9. A small capacity semiconductor diode as set forth in claim 8 wherein said substrate is sapphire and said layer is silicon.

10. A small capacity semiconductor diode as set forth in claim 8 wherein said metallizations are spaced apart in the area of the junction, and a passivation coating covers the junction between the metallizations.

11. A small capacity semiconductor diode as set forth in claim 8 wherein said crystalline layer has a substantially planar continuous uninterrupted surface.

12. A small capacity semiconductor diode as set forth in claim 14 wherein the P-N junction extends normal to said planar surface and to the longitudinal dimension of said layer.

References Cited

UNITED STATES PATENTS

| | | | |
|---|---|---|---|
| 2,829,075 | 4/1958 | Pankove | 148—1.5 |
| 3,290,570 | 12/1966 | Cunningham et al. | 317—240 |
| 2,714,702 | 8/1955 | Shockley | 323—66 |
| 3,393,088 | 7/1968 | Manasevit et al. | 117—106 |
| 3,385,731 | 5/1968 | Weimer | 117—212 |

FOREIGN PATENTS 883,468 11/1961 Great Britain.

JAMES D. KALLAM, Primary Examiner

SIMON BRODER, Assistant Examiner

U.S. Cl. X.R.

317—234

PO-1050
(5/69)

UNITED STATES PATENT OFFICE
CERTIFICATE OF CORRECTION

Patent No. 3,486,087 Dated Dec. 23, 1969

Inventor(s) Wilhelm H. Legat and Alan F. Dixon

It is certified that error appears in the above-identified patent and that said Letters Patent are hereby corrected as shown below:

Claim 1, line 18 change "claim 1" to -- claim 2 --

Claim 12, line 26 change "claim 14" to -- claim 11 --

SIGNED AND
SEALED
NOV 3 1970

(SEAL)
Attest:

Edward M. Fletcher, Jr.
Attesting Officer

WILLIAM E. SCHUYLER, JR.
Commissioner of Patents